(12) United States Patent
Zhou et al.

(10) Patent No.: US 6,476,638 B1
(45) Date of Patent: Nov. 5, 2002

(54) INPUT DRIVER CIRCUIT WITH ADJUSTABLE TRIP POINT FOR MULTIPLE INPUT VOLTAGE STANDARDS

(75) Inventors: Shi dong Zhou; Gubo Huang, both of Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/876,676

(22) Filed: Jun. 7, 2001

(51) Int. Cl.[7] ........................... H03K 19/0185
(52) U.S. Cl. .................. 326/81; 326/83; 326/68
(58) Field of Search .................. 326/68, 70, 71, 326/73, 76, 80, 81, 83, 86, 37

(56) References Cited

U.S. PATENT DOCUMENTS

| | | | |
|---|---|---|---|
| 4,612,466 A | | 9/1986 | Stewart |
| 4,783,607 A | * | 11/1988 | Hsieh ........................... 326/71 |
| 4,999,529 A | * | 3/1991 | Morgan et al. ............... 326/83 |
| 5,304,872 A | * | 4/1994 | Avraham et al. .............. 326/71 |
| 5,341,045 A | * | 8/1994 | Almulla ....................... 326/83 |
| 5,894,238 A | | 4/1999 | Chien |
| 6,177,819 B1 | | 1/2001 | Nguyen |

* cited by examiner

Primary Examiner—Michael Tokar
Assistant Examiner—Don Phu Le
(74) Attorney, Agent, or Firm—Nenad Pejic; Lois D. Cartier

(57) ABSTRACT

An input driver circuit for accommodating a plurality of input/output voltage standards is provided. The input driver circuit employs an adjustable trip point that can be calibrated for multiple input voltage standards. The adjustable trip point is provided by a trigger circuit. A control circuit determines whether the trigger circuit is on or off by comparing a configuration input thereof with a reference power supply input thereof. When the trigger circuit is on, the trip point is active during a low to high transition of the signal input.

19 Claims, 4 Drawing Sheets

INPUT DRIVER CIRCUIT WITH ADJUSTABLE TRIP POINT FOR MULTIPLE INPUT VOLTAGE STANDARDS

FIELD OF THE INVENTION

The invention relates generally to input/output circuits and, more particularly, to an input driver circuit having the capability to accept multiple input voltage standards.

BACKGROUND OF THE INVENTION

Integrated circuits (ICs) typically include numerous transistors that are fabricated on, for example, silicon wafers. To increase production yields and lower total IC device costs, semiconductor manufacturers are continually striving to reduce the size of the transistors in IC devices. However, for a given power supply voltage, the electric field strength, e.g., the change in voltage per unit length, that these transistors are exposed to increases as the size of the transistors is reduced. As IC device geometries shrink to the deep sub-micron level (i.e., less than 0.5 um), the electric fields generated by the 5V supply voltages historically used to power IC devices can degrade or even destroy the transistors in those IC devices. For example, the performance of a sub-micron MOS transistor having an effective channel length of 0.35 um is impaired under a 5V supply voltage due to injection of hot electrons into the gate of the MOS transistor. In addition, the electric field generated by a 5V supply voltage across a submicron MOS transistor can also cause total failure due to gate oxide breakdown. Therefore, a reduced power supply voltage must be available to reap the cost and efficiency benefits of deep sub-micron transistors while maintaining overall IC performance and reliability. Recent trends toward the use of 3.3V and lower supply voltages is indicative of this need, and further reductions in supply voltages will become necessary as IC device geometries continue to shrink.

At the same time, a 3.3V external supply voltage will not necessarily be available to power deep sub-micron IC devices. While memory and microprocessor boards can often be custom designed to provide 3.3V to those IC devices, other types of IC devices may not have that option available. For example, Programmable Logic Devices (PLDS) are a type of IC device comprising user-configurable logic elements and interconnect resources that are programmable to implement user-defined logic operations (that is, a user's circuit design). PLDs have begun to incorporate 0.18 um transistors that require a 1.8V power supply voltage. However, because of their configurable purpose, PLDs will often be used in systems that operate under many different power supply voltages due to other IC devices in the system that require, for example, LVCMOS and LVTTL input/output (I/O) standards (e.g., 5V, 3.3V, 2.5V, 1.5V, etc.).

An approach compensating for these differing (I/O) voltage standards is to utilize a double-inverter circuit. The double-inverter circuit has an input inverter and an output inverter serially coupled together. The input inverter circuit accepts a signal according to its particular (I/O) voltage standard and outputs an inverted signal according to the same voltage standard to the output inverter circuit. The output inverter circuit accepts this signal and outputs an inverted signal according to the (I/O) standard of the circuitry down stream of the double-inverter circuit. Typically, the output inverter circuit steps down the signal level to the internal power supply voltage of the down stream circuitry.

This method has numerous disadvantages. One disadvantage is that the input inverter circuitry must be designed according to the usually higher voltage requirements of the input signal's (I/O) standard. This means that the circuitry usually requires more silicon in an IC to implement than lower voltage circuits. Hence, it takes up more room on an IC chip and, therefore, makes the IC chip physically larger. Moreover, because the input inverter circuitry is larger and designed to work with higher voltage standards, it usually has higher threshold voltages that contribute to slower operation than circuitry designed to work with lower voltage standards. Still further, the input inverter circuitry usually derives its switching characteristic from the external power supply forming the basis of the higher input signal voltage standard. Hence, any noise present in the external power supply voltage necessarily tends to permeate through the input inverter circuitry and on through the output inverter circuitry. Such a condition can cause false outputs by the output inverter circuitry.

Hence, a system and method for safely managing varying I/O signal standards that does not suffer from the above-mentioned disadvantages is highly desirable.

SUMMARY OF THE INVENTION

According to one embodiment of the present invention, an input driver circuit for accommodating a plurality of input/output voltage standards is provided. The input driver circuit employs an adjustable trip point that can be calibrated for multiple input voltage standards. The input driver circuit has, for example, an inverter circuit in circuit communication with a signal input and has an output. The input driver circuit further has a trigger circuit cooperating with the signal input and the inverter circuit. A control circuit cooperates with the trigger circuit to determine whether the trigger circuit should be on or off by comparing a configuration input and a reference power supply input. Depending on whether a voltage at the reference supply input is greater or less than a voltage at the configuration input, the control circuit turns on and off the trigger circuit. When the trigger circuit is on, it has a trip point that is active during a low to high transition of the signal input.

Hence, it is an advantage of the present invention to provide an input driver circuit for multiple input signal voltage standards.

It is another advantage of the present invention to provide an input driver circuit having an adjustable trip point for rejecting noisy input signals.

It is yet another advantage of the present invention to provide an input circuit that automatically turns on and off the trip point depending on the input voltage standard.

It is yet another advantage of the present invention to provide an input circuit that can be configured via a single configuration bit.

BRIEF DESCRIPTION OF THE DRAWINGS

In the accompanying drawings which are incorporated in and constitute a part of the specification, embodiments of the invention are illustrated, which, together with a general description of the invention given above, and the detailed description given below, serve to example the principles of this invention.

DETAILED DESCRIPTION OF ILLUSTRATED EMBODIMENT

Figure 1:
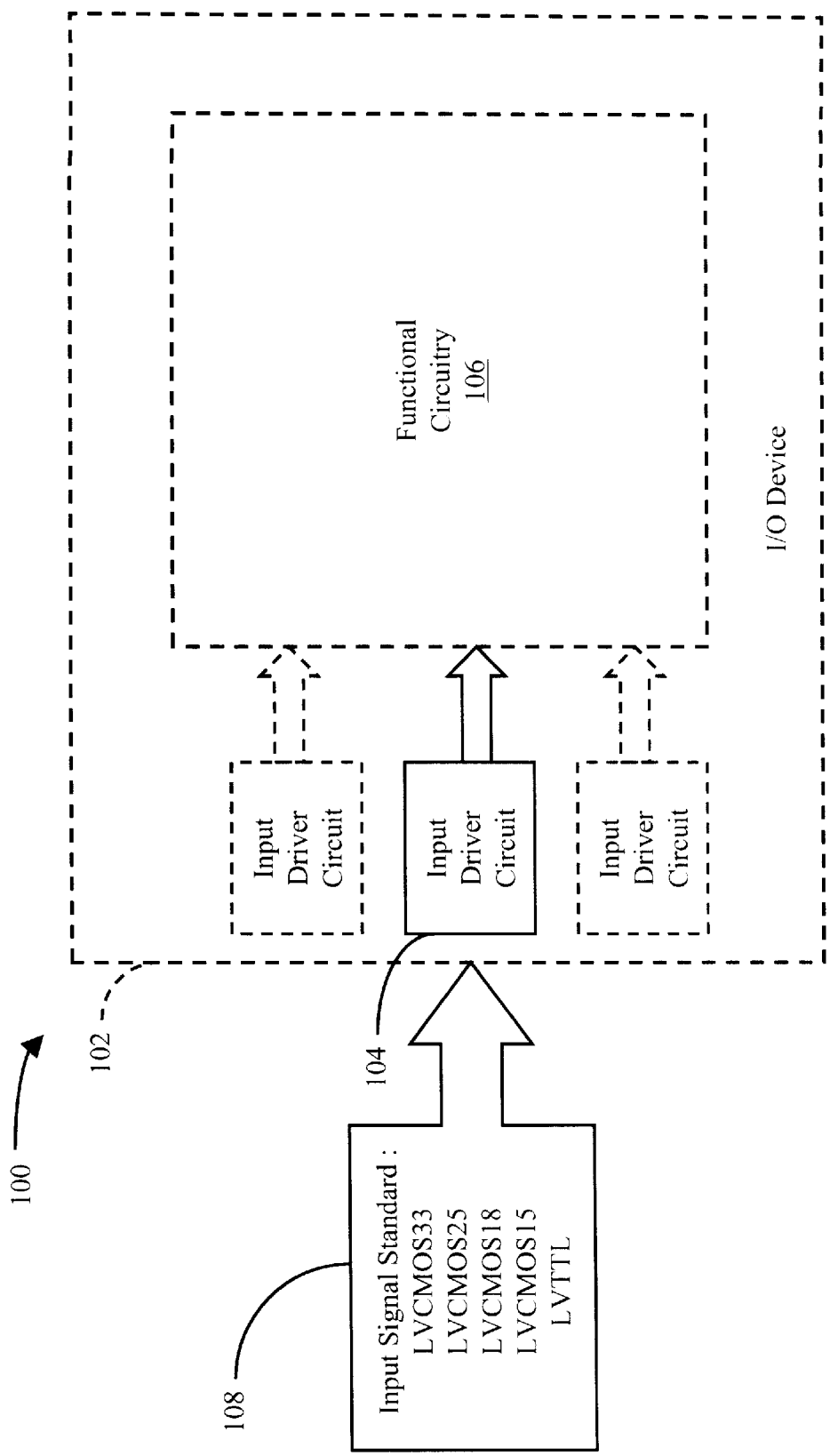
FIG. 1 is a general block diagram of a system 100 of the present invention.

Referring to FIG. 1, a system 100 of the present invention is shown. The system 100 has a digital input/output (I/O) device 102 for accepting digital data, processing the data, and generating a data output. Examples of such devices 102 include Programmable Logic Devices (PLDs) such as the COOLRUNNER® XPLA3 CPLD manufactured by Xilinx, Inc. of San Jose, Calif. Other devices include Field-Programmable Gate Arrays (FPGAs), memories, processors, and others that must interface with other devices on a digital system level.

In this regard, device 102 is schematically illustrated having a plurality of input driver circuits, such as at 104, and functional circuitry 106. The input driver circuit 104 is responsible for accepting an outside digital signal as an input to device 102. According to the present invention, the outside digital signal can be defined by any one of a plurality of I/O signal voltage standards, including LVCMOS33, LVCMOS25, LVCMOS18, LVCMOS15, LVTTL, and others. A brief summary of these standards is presented below:

LVCMOS33—3.3 Volt Low-Voltage CMOS:

This standard is an extension of the LVCMOS standard (JESD 8.-5). It is used in general purpose 3.3V applications. The standard requires a 3.3V input/output source voltage, but does not require the use of a reference voltage or a termination voltage.

LVCMOS25—2.5 Volt Low-Voltage CMOS:

This standard is an extension of the LVCMOS standard (JESD 8.-5). It is used in general purpose 2.5V or lower applications. This standard requires a 2.5V input/output source voltage, but does not require the use of a reference voltage or a board termination voltage.

LVCMOS18—1.8 Volt Low-Voltage CMOS:

This standard is an extension of the LVCMOS standard. It is used in general purpose 1.8V applications. The use of a reference voltage or board termination voltage is not required.

LVCMOS15—1.5 Volt Low-Voltage CMOS:

This standard is an extension of the LVCMOS standard. It is used in general purpose 1.5V applications. The use of a reference voltage or a board termination voltage is not required.

LVTTL—Low-Voltage TTL

The low-voltage TTL, or LVTTL, standard is a general purpose EIA/JESDSA standard for 3.3V applications that use an LVTTL input buffer and a Push-Pull output buffer. This standard requires a 3.3V input and output source voltage ($V_{CCO}$), but does not require the use of a reference voltage ($V_{REF}$) or a termination voltage ($V_{TT}$).

Once the input driver circuit 104 has received an input signal, it then appropriately conditions the signal to the input level (e.g., amplitude) required by the functional circuitry 106. The functional circuitry 106 can be, for example, a programmable logic circuit, a processing circuit, a memory circuit, or any other type of circuit or component capable of storing, retrieving, or logically processing data presented thereto.

Figure 2:
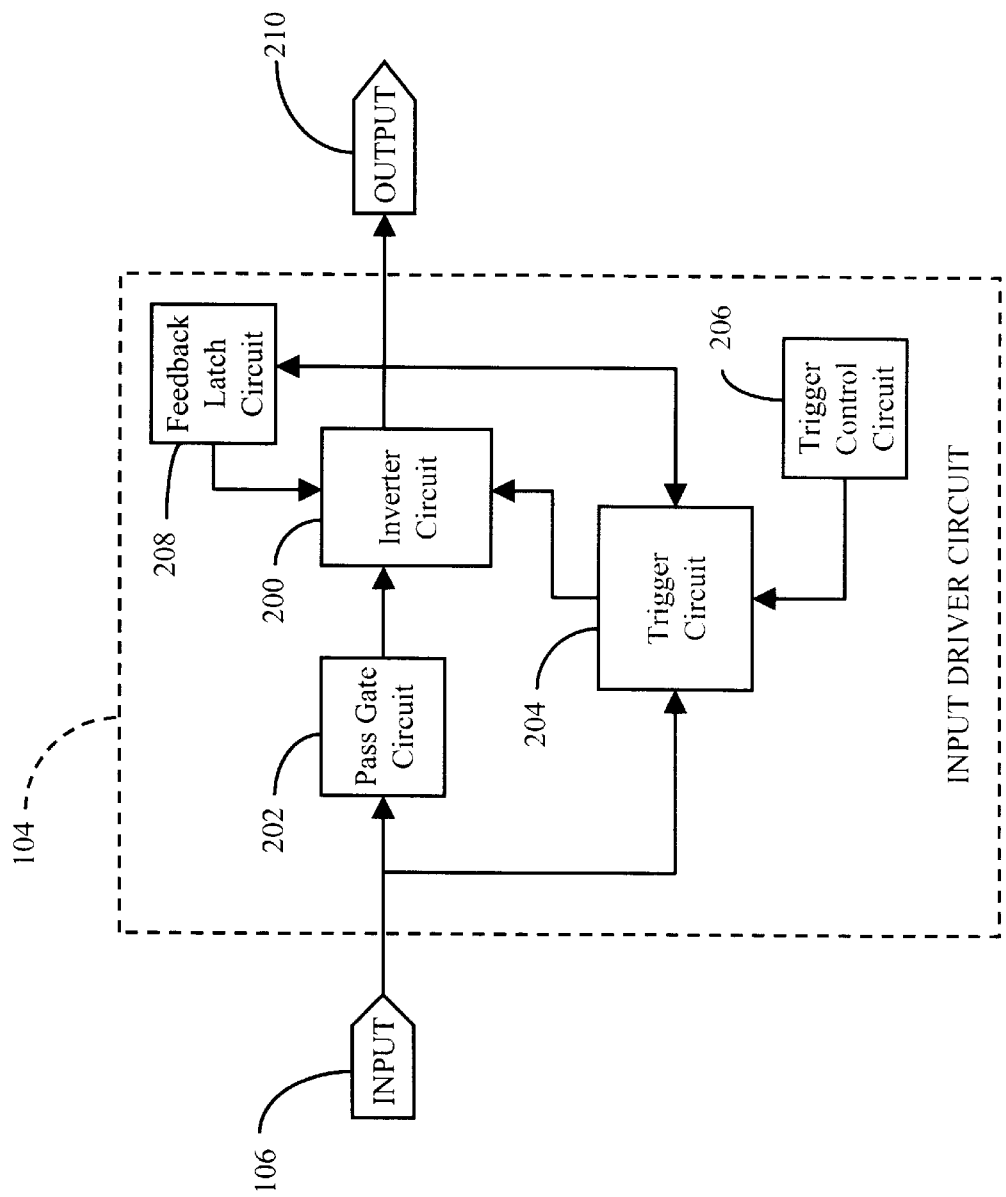
FIG. 2 is a high-level block diagram of an input driver circuit of the present invention.

Illustrated in FIG. 2 is a high-level block diagram of a preferred embodiment of the input driver circuit 104 of the present invention. As discussed above, the input driver circuit 104 is capable of translating an input signal at input 106 having a first voltage standard to a signal at output 210 that is defined by a second voltage consistent with the circuitry to which the input driver 104 is connected. As shown, the input driver circuit 104 has a plurality of components including input 106, inverter circuit 200, pass gate circuit 202, trigger circuit 204, trigger control circuit 206, feedback latch circuit 208, and output 210. The pass gate circuit 202 limits the amplitude of the signal at input 106 based on the input driver circuit's internal power supply voltage ($V_{ddi}$). The inverter circuit 200 takes a signal at its input 106 and inverts its state at output 210. For example, if a signal at input 106 is a logic high, then the output 210 of inverter circuit 200 is a logic low, and vice-versa.

The trigger circuit 204 functions as a half-Schmitt trigger and is configured to modify the behavior of the inverter circuit 200. The trigger circuit 204 modifies the behavior of the inverter circuit 204 by introducing a trip point or level that is active when a signal at input 106 transitions from a logic low state to a logic high state. In this manner, a noisy logic low signal at input 106 will not be falsely interpreted as a logic high signal. For example, under the LVCMOS33 standard, a logic low signal is approximately 0V and a logic high signal is approximately 3.3V. Hence, it is important that the input driver circuit 104 does not interpret, for example, a 1.0V signal at input 106 as a logic high since it is higher than the logic low level of approximately 0V. Hence, by adjusting the trip point of trigger circuit 204, the amplitude or voltage of the signal at input 106, when rising from a logic low level to a logic high level, that causes the inverter circuit 200 to invert its output 210 can be controlled.

Trigger control circuit 206 determines if the trigger circuit 204 is on or off. This control function is determined by knowledge of whether or not the signals that input 106 are defined by an I/O signal standard having a higher amplitude or voltage ($V_{dde}$) than the input driver circuit's internal power supply voltage ($V_{ddi}$). For example, if the signals at input 106 will have an I/O signal standard defined by LVCMOS33 (power supply or source voltage=3.3V) and the input driver circuit 104 signals are defined by the standard LVCMOS18 (power supply or source voltage=1.8V), then trigger control circuit 206 turns on trigger circuit 204. As will be described shortly, the trigger control circuit 206 is preferably illustrated by two embodiments.

Feedback latch circuit 208 provides a latching mechanism to guarantee that, once the input signal transition from logic low to logic high has occurred at input 106, the inverter circuit 200 output state is maintained in the logic low state until the signal at input 106 transitions back to its logic low state.

Figure 3:
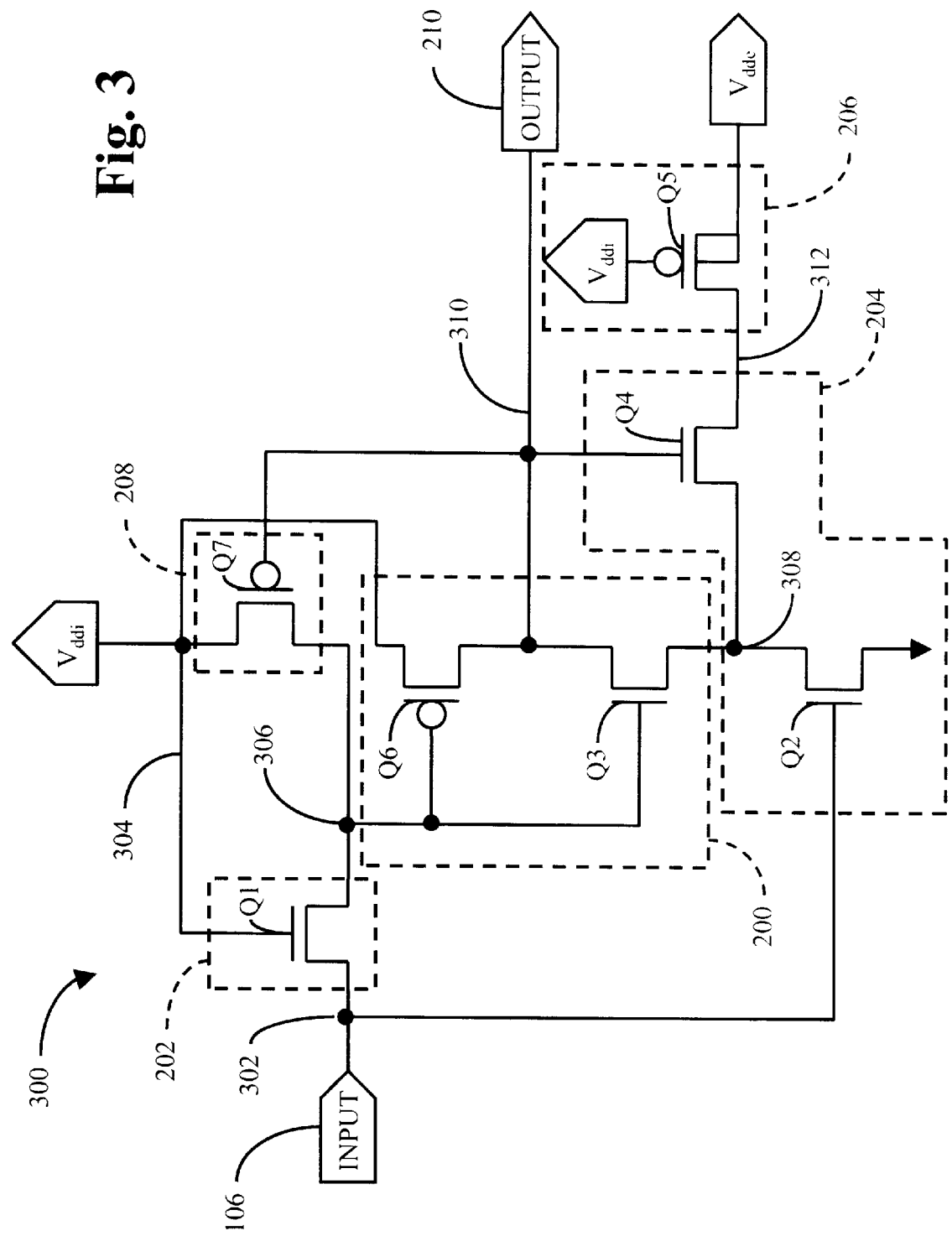
FIG. 3 is a schematic diagram illustrating a first embodiment of the present invention.

Illustrated in FIG. 3 is a circuit 300 illustrating a first preferred embodiment of input driver circuit 104. In this regard, input driver circuit 104 is preferably implemented by a plurality of metal-oxide semiconductor field-effect transistors (MOSFETs). Fundamental to the understanding of the present invention is a transistor's ability to act as a switch and a brief review of a MOSFET's switching characteristics is warranted. In particular, a p-type MOSFET (pmos) will form a closed circuit between its source and drain terminals when its gate-tosource voltage (Vgs) is less than a threshold voltage (Vt). When Vgs is greater than Vt, the pmos transistor forms an open circuit between its source and drain. Conversely, an ntype MOSFET (nmos) will form a closed circuit between its drain and source terminals when Vgs is greater than Vt. Hereinafter, the term "on" and "partially on" will refer to a MOSFET in the closed circuit condition and the term "off" will refer to a MOSFET in the open circuit condition.

In this regard, inverter circuit 200 is implemented via a pull-up circuit, pmos transistor Q6, and a pull-down circuit, nmos transistor Q3, and has an input at node 306 and an output at node 310. Pass gate circuit 202 is implemented as nmos transistor Q1. Trigger circuit 204 is preferably implemented via nmos transistors Q2 and Q4. Trigger control circuit 206 is preferably implemented as pmos transistor Q5 with its gate connected to $V_{ddi}$ and its substrate and source connected to $V_{dde}$ (i.e., the input signal voltage standard). The gate connection of transistor Q5 forms a configuration input that ultimately turns on and off or activates and deactivates trigger circuit 204. The source connection of transistor Q5 forms a reference power supply input. Latch circuit 208 is preferably implemented as pmos transistor Q7. The gate, source, and drain connections of each transducer are as shown in FIG. 3.

The operation of the circuit will now be described by way of example when the internal power supply voltage of input driver circuit 104 is approximately 1.8V ($V_{ddi}$=1.8V) implementing LVCMOS18 and the signal at input 106 has a voltage standard defined by LVCMOS33 ($V_{dde}$=3.3V). The description will begin by describing the circuit's operation starting with a logic low (0V) signal at input 106 transitioning to a logic high (3.3V). When the signal at input 106 is low, node 302 is also low. This causes transistor Q1 to be on because its gate is high, resulting in node 306 being low. When node 306 is low, transistor Q6 is on and transistor Q3 is off. Since the source of transistor Q6 is connected to $V_{ddi}$ (e.g., 1.8V), turning transistor Q6 on causes node 310 to be high. Hence, a logic low signal at input 106 produces a logic high signal at output 210 where the logic high signal is at approximately 1.8V.

As the voltage of the signal at input 106 begins to rise, the voltage of nodes 302 and 306 also begins to rise since pass gate circuit 202 transistor Q1 is on. This causes transistors Q2, Q3, and Q6 to all be partially on. The net result is that transistor Q2 tries to bring node 308 to ground level (e.g., 0V) while transistor Q4 tries to maintain node 308 at approximately $V_{ddi}$-$V_{tQ4}$, where $V_{tQ4}$ is the threshold voltage of transistor Q4. By appropriately sizing transistors Q2 and Q4, it is possible to determine at what voltage level transistor Q2 will be able to bring node 308 sufficiently to ground level. This voltage level defines the trip point of trigger circuit 204. For example, if transistors Q2 and Q4 are sized such that a voltage of 2.5V at input 106 is required before transistor Q2 can bring node 308 to substantially ground, then the trip point of trigger circuit 204 is approximately 2.5V. In this example, if the signal at input 106 transitions from 0 to 1V, transducer Q2 will not be able to pull node 308 to ground because it requires a gate-to-source voltage of approximately 2.5V. This means that node 310 and output 210 will remain in the aforementioned logic high state (approximately 1.8V).

However, if the voltage of the signal at input 106 is at or crosses the trip point of trigger circuit 204, then transistor Q2 will pull node 308 to ground (approximately 0V). Since transistor Q3 will be either fully or partially on, node 310 will also be pulled down to ground. This causes output 210 to change to the logic low state. When node 310 is pulled to ground, transistor Q4 turns off and feedback latch circuit 208 transistor Q7 turns on. Turning transistor Q4 off deactivates trigger circuit 204, but does not turn it off. Trigger circuit 204 becomes active again when input 106 is low and output 210 goes high. Turning on transistor Q7 latches transistor Q3 on and ensures that transistor Q6 is fully off thereby making certain that node 310 is maintained at substantially ground or logic low level.

Therefore, by appropriately choosing the electrical characteristics of transistors Q2 and Q4 in the trigger circuit 204, the appropriate trip point upon which a signal on input 106 rising from a logic low to a logic high causes the output 210 to change states can be determined. For example, by appropriately physically sizing transistors Q2 and Q4, their electrical characteristics can be tuned to desired levels thereby adjusting the level of the trip point that causes node 308 to be pulled down to substantially ground.

By appropriately defining the trip point of trigger circuit 204, a noisy logic low signal on input 106 will not cause a false logic high signal at output 210. As described above, if the trip point is set at 2.5V for an LVCMOS33 signal at input 106, then a signal transition at input 106 from 0V to less than 2.5V will not cause a change in state at output 210. Hence, significant noise rejection is provided on input 106 for such conditions.

Continuing the operational description of circuit 300, when the signal at input 106 reaches logic high, the output 210 is logic low and the trigger circuit 204 is not active because transistor Q4 is off. When the signal at input 106 begins to fall, the voltage at nodes 302 and 306 also begins to fall. This causes transistors Q2 and Q3 to turn off and turns on transistor Q6. Turning on transistor Q6 causes node 310 to change from low to high. When node 310 is high, output 210 is also high and transistor Q4 turns on, while transistor Q7 turns off. As described above, when transistor Q4 is turned on, the trigger circuit 204 is active once again and the cycle repeats. Since the trigger circuit 204 has a trip point that is active upon an input 106 transition from low to high and not vice-versa, trigger circuit 204 can be referred to as a half-Schmitt trigger because it has only one out of the two trip points normally associated with a Schmitt trigger.

With regard to trigger control circuit 206, it can be seen that transistor Q5 is on if the internal power supply or source $V_{ddi}$ is less than the input 106 signal power supply or source voltage $V_{dde}$. When transistor Q5 is on, so is trigger circuit 204 because the voltage $V_{dde}$ is available, by virtue of transistor Q5 being on, to be placed on node 308 by transistor Q4. However, transistor Q5 is off when the configuration input $V_{ddi}$ is greater than or equal to the reference power supply input $V_{dde}$. When transistor Q5 is off, so is the trigger circuit 204 because the voltage $V_{dde}$ is now blocked by off transistor Q5 and, hence, turning on and off transistor Q4 has no effect on node 308. Node 308 is then only affected by the state (on or off) of transistor Q2. Configured as such, trigger control circuit 206 automatically turns on trigger circuit 204 if the $V_{dde}$ of the system generating the signal at input 106 is greater than $V_{ddi}$. Conversely, if the system generating the signal at input 106 has a $V_{dde}$=$V_{ddi}$, then trigger control circuit 206 knows that trigger circuit 204 is not needed and turns it off by turning off transistor Q5. Hence, circuit 300 can be applied to any system having a power supply voltage $V_{dde}$ that is equal to or greater than the internal power supply voltage $V_{ddi}$ of the input driver circuit 104 because it is capable of automatically sensing the difference between $V_{dde}$ and $V_{ddi}$. While the above circuit description was described by way of example using $V_{ddi}$=1.8V (LVCMOS18) and $V_{dde}$=3.3V (LVCMOS33), the circuit's operation with respect to any combination of $V_{dde}$ and $V_{ddi}$ should now be understood.

Figure 4:
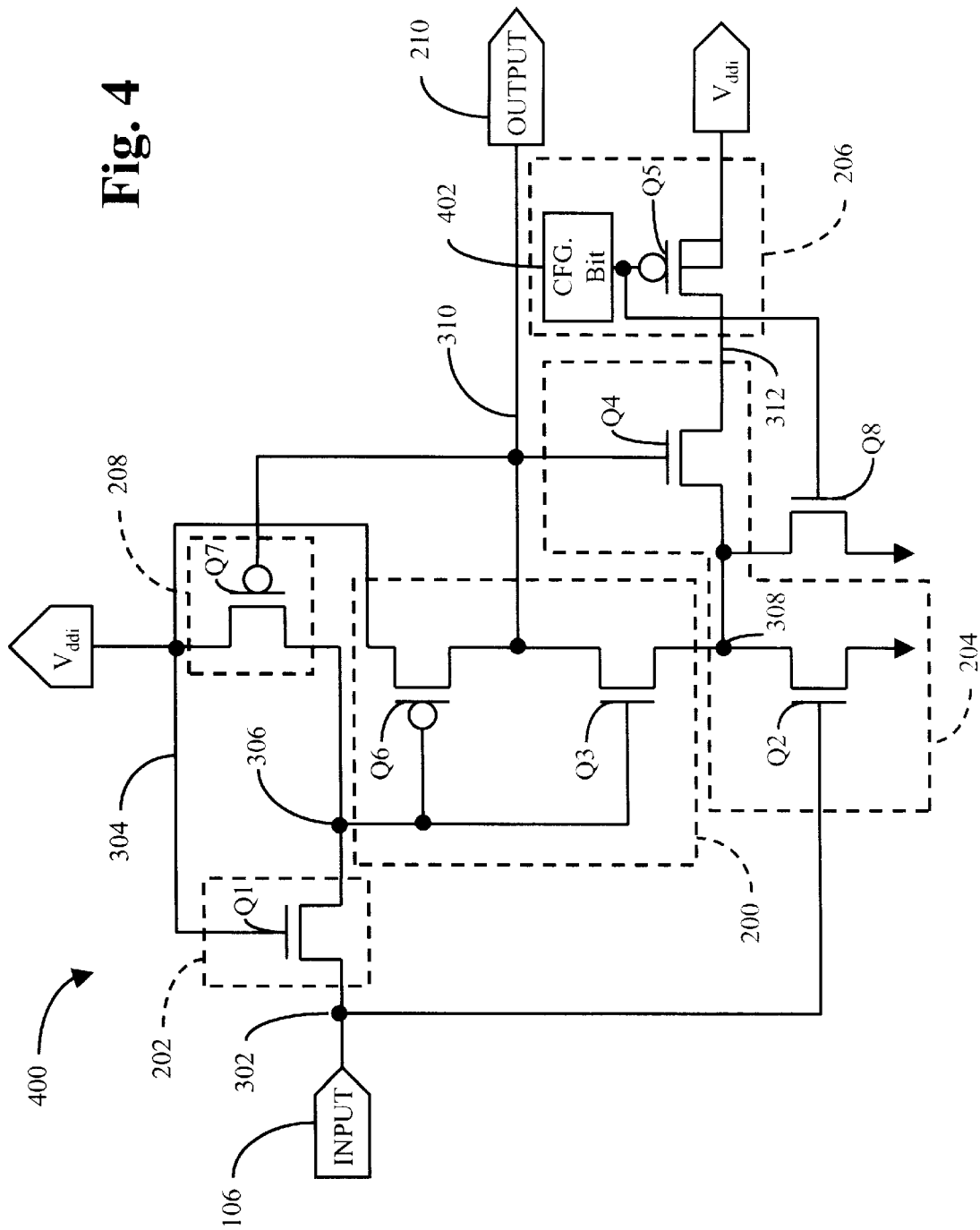
FIG. 4 is a schematic diagram illustrating a second embodiment of the present invention.

Referring now to FIG. 4, a circuit 400 illustrating a second preferred embodiment of input driver circuit 104 is shown. This embodiment is identical to circuit 300 of FIG. 3, except for the trigger control circuit 206 and the addition of nmos transistor Q8. These differences allow embodiment 400 to be selectively controlled via the state of configuration bit 402 and provides for slightly faster overall operation than circuit 300 of FIG. 3.

In this regard, the state of the configuration bit 402 determines whether transistor Q5 and Q8 are on or off. For example, if configuration bit 402, in a first state is low (e.g., 0V), then transistor Q5 is on and transistor Q8 is off. This configuration resembles the configuration of circuit 300 of FIG. 3 when the configuration input $V_{ddi}$ is less than the reference power supply input $V_{dde}$, thereby placing trigger circuit 204 in the on state. In this scenario, the operation of circuit 400 is identical to circuit 300. In a second state, the configuration bit 402 at the configuration input of transistor Q5 causes transistor Q5 to be off, thereby placing trigger circuit 204 in its off state. The second state can be defined by any configuration input voltage that turns transistor Q5 off. Hence, by controlling the state of configuration bit 402, the trigger control circuit 206 can be turned on and off, thereby turning trigger circuit 204 on and off. As described above, turning trigger control circuit 206 on and off has the effect of making voltage $V_{ddi}-V_{tQ4}$ either available or not for placing on node 308.

The state of configuration bit 402 can be determined via plurality of mechanisms. For example, the state can be stored in a memory, which is read and then output to the gate of transistor Q5. Alternatively, logic may be provided for polling the system to which input driver circuit 104 is connected and then determine the state of configuration bit 402, which would be based on the system's I/O signal standard (e.g., LVCMOS33, LVCMOS25, etc.). Hence, similar to circuit 300, circuit 400 is also applicable to any system which generates an input signal having a power supply voltage $V_{dde}$ that is equal to or greater than the internal power supply voltage $V_{ddi}$ of the input driver circuit 104.

As mentioned above, circuit 400 operates faster than circuit 300 of FIG. 3 when the trigger circuit 204 is off. In this regard, transistor Q8 is capable of being maintained in its on state all the time via configuration bit 402 thereby always providing a ground connection to node 308. Increased circuit speed is achieved because transistor Q2's electrical characteristics have been determined, at least in part, with the electrical characteristics of transistor Q4 in mind. Hence, transistor Q2 may not turn on as fast one would like due to its larger size and higher threshold voltage—which means that node 308 may not be pulled to ground as fast as one would like. In this regard, transistor Q8, whose electrical characteristics are not based on the other transistors, can have a lower threshold voltage for turning on and off, which allows node 308 to pulled to ground independent of the signal at input 106 and, hence, transistor Q2's threshold voltage. With this aside, in all other circumstances the operation of circuit 400 is identical to that of circuit 300 of FIG. 3. It should also be noted that transistor Q8 can be added to circuit 300 with the same connections shown in FIG. 4 to thereby provide the same benefits.

In sum, the present invention provides an input driver circuit design having an adjustable trip point settable for multiple input voltage standards. The adjustable trip point is provided by a trigger circuit that is active on an input signal transition from logic low to logic high. A trigger control circuit determines whether the trigger circuit is on or off based on a comparison of the configuration input and reference power supply voltage input to the trigger control circuit. In this manner, an integrated circuit designed with, for example, a LVCMOS18 input signal standard can be connected to a system using a higher voltage standard such as, for example, LVCMOS33 or LVCMOS25, without having to manually configure the integrated circuit to work with the higher voltage standard. The integrated circuit's trigger control circuit detects such a state and activates the trigger circuit. By appropriately setting the trip point above the logic low level, the trigger circuit also has the ability to reject noisy logic low input signals thereby preventing false inputs.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. For example, the circuits can be implemented with equivalent designs that perform the required functions. For example, the polarity of the transistors implementing the circuitry can be reversed, where nmos is implemented as pmos and vice-versa. Therefore, the invention, in its broader aspects, is not limited to the specific details, the representative apparatus, and illustrative examples shown and described. Accordingly, departures can be made from such details without departing from the spirit or scope of the applicant's general inventive concept.

We claim:

1. A digital system for performing logical functions, comprising:

a functional logic circuit; and an input driver circuit cooperating with the functional logic circuit and capable of accommodating a plurality of input/output voltage standards, the input driver circuit comprising:

an inverter circuit in circuit communication with a signal input and having an output;

a trigger circuit in circuit communication with the inverter circuit and having a trip point based on the input/output voltage standard of the signal input; and a control circuit cooperating with the trigger circuit and having a configuration input that turns on and off the trigger circuit, wherein the control circuit has a reference power supply input, and wherein the control circuit comprises a transistor and the configuration input comprises a gate connection to the input driver circuit internal power supply voltage and the reference power supply input comprises a source connection to a voltage source substantially equivalent to one of the plurality of input/output voltage standards.

2. A digital system for performing logical functions, comprising:

a functional logic circuit; and an input driver circuit cooperating with the functional logic circuit and capable of accommodating a plurality of input/output voltage standards, the input driver circuit comprising:

an inverter circuit in circuit communication with a signal input and having an output;

a trigger circuit in circuit communication with the inverter circuit and having a trip point based on the input/output voltage standard of the signal input; and a control circuit cooperating with the trigger circuit and having a configuration input that turns on and off the trigger circuit, wherein the trip point is at least partly based on a first transistor's physical characteristics and a second transistor's physical characteristics.

3. A digital system for performing logical functions, comprising:

a functional logic circuit; and an input driver circuit cooperating with the functional logic circuit and capable of accommodating a plurality of input/output voltage standards, the input driver circuit comprising:

an inverter circuit in circuit communication with a signal input and having an output;

a trigger circuit in circuit communication with the inverter circuit and having a trip point based on the input/output voltage standard of the signal input;

a control circuit cooperating with the trigger circuit and having a configuration input that turns on and off the trigger circuit; and a pass gate circuit cooperating with the inverter circuit to allow signals below a predetermined threshold to pass to the signal input.

4. An input driver circuit for accommodating a plurality of input/output voltage standards, the circuit comprising:

an inverter means having an input and an output;

a trigger means cooperating with the inverter means and having a trip point based on the input/output voltage standard of the input;

a control means cooperating with the trigger means and comprising a configuration means for configuring the trigger means between a first and a second state; and a pass gate means cooperating with the inverter means to allow signals below a predetermined threshold to pass to the input.

5. The circuit of claim 4 wherein the pass gate means is configured to limit the amplitude of an input signal to the inverter means when the input signal amplitude is above the internal power supply voltage of the inverter means.

6. An input driver circuit for accommodating a plurality of input/output voltage standards, the circuit comprising:

an inverter circuit having a pull-up circuit, a pull-down circuit, a signal input, and a signal output, wherein the signal input and the signal output are in communication with the pullup circuit and the pull-down circuit;

a trigger circuit cooperating with the inverter circuit and having a trip point based on the input/output voltage standard of the signal input; and a control circuit cooperating with the trigger circuit and having a configuration input that turns on and off the trigger circuit, wherein the control circuit has a reference power supply input, and wherein the control circuit comprises a transistor and the configuration input comprises a gate connection to the input driver circuit internal power supply voltage and the reference power supply input comprises a source connection to a voltage source substantially equivalent to one of the plurality of input/output voltage standards.

7. An input driver circuit for accommodating a plurality of input/output voltage standards, the circuit comprising:

an inverter means having an input, output, and an inverter circuit;

a half-Schmitt trigger circuit in circuit communication with the inverter means and comprising a trip point based on the input/output voltage standard of the input; and a control circuit means in circuit communication with the half-Schmitt trigger circuit and having a configuration input that turns on and off the trigger circuit.

8. An input driver circuit for accommodating a plurality of input/output voltage standards, the circuit comprising:

an inverter circuit having a pull-up circuit, a pull-down circuit, a signal input, and a signal output, wherein the signal input and the signal output are in communication with the pull-up circuit and the pull-down circuit;

a trigger circuit cooperating with the inverter circuit and having a trip point based on the input/output voltage standard of the signal input;

a control circuit cooperating with the trigger circuit and having a configuration input that turns on and off the trigger circuit; and a feedback latch circuit cooperating with the inverter circuit to latch the inverter circuit in a first state.

9. An input driver circuit for accommodating a plurality of input/output voltage standards, the circuit comprising:

an inverter circuit having a pull-up circuit, a pull-down circuit, a signal input, and a signal output, wherein the signal input and the signal output are in communication with the pullup circuit and the pull-down circuit;

a trigger circuit cooperating with the inverter circuit and having a trip point based on the input/output voltage standard of the signal input; and a control circuit cooperating with the trigger circuit and having a configuration input that turns on and off the trigger circuit, wherein the trigger circuit comprises at least a first transistor having a first electrical characteristic and a second transistor having a second electrical characteristic.

10. The circuit of claim 9 wherein the trip point is at least partly based on the first and second electrical characteristics of the first and second transistors.

11. The circuit of claim 9 wherein the first and second electrical characteristics are at least partially based on physical attributes of the first and second transistors.

12. An input driver circuit for accommodating a plurality of input/output voltage standards, the circuit comprising:

an inverter circuit having a pull-up circuit, a pull-down circuit, a signal input, and a signal output, wherein the signal input and the signal output are in communication with the pull-up circuit and the pull-down circuit;

a trigger circuit cooperating with the inverter circuit and having a trip point based on the input/output voltage standard of the signal input;

a control circuit cooperating with the trigger circuit and having a configuration input that turns on and off the trigger circuit; and a pass gate circuit cooperating with the inverter circuit to allow signals below a predetermined threshold to pass to the signal input.

13. The circuit of claim 12 wherein the pass gate circuit is configured to limit the amplitude of an input signal to the inverter circuit when the input signal amplitude is above the internal power supply voltage of the inverter circuit.

14. An input driver circuit for accommodating a plurality of input/output voltage standards, the circuit comprising:

an inverter circuit having a pull-up circuit, a pull-down circuit, a signal input, and a signal output, wherein the signal input and the signal output are in communication with the pull-up circuit and the pull-down circuit;

a trigger circuit cooperating with the inverter circuit and having a trip point based on the input/output voltage standard of the signal input; and a control circuit cooperating with the trigger circuit and having a configuration input that turns on and off the trigger circuit, wherein the trigger circuit is a half-Schmitt trigger circuit.

15. An input driver circuit for accommodating a plurality of input/output voltage standards, the circuit comprising:

an inverter means having an input and an output;

a trigger means cooperating with the inverter means and having a trip point based on the input/output voltage standard of the input; and a control means cooperating with the trigger means and comprising a configuration means for configuring the trigger means between a first and a second state, wherein the control means has a reference power supply input, and wherein the control means comprises a transistor having a gate connection to the input driver circuit internal power supply voltage and the reference power supply input comprises a source connection to a voltage source substantially equivalent to one of the plurality of input/output voltage standards.

16. An input driver circuit for accommodating a plurality of input/output voltage standards, the circuit comprising:

an inverter means having an input and an output;

a trigger means cooperating with the inverter means and having a trip point based on the input/output voltage standard of the input;

a control means cooperating with the trigger means and comprising a configuration means for configuring the trigger means between a first and a second state; and a feedback latch means cooperating with the inverter means to latch the inverter means in a first state.

17. An input driver circuit for accommodating a plurality of input/output voltage standards, the circuit comprising:

an inverter means having an input and an output;

a trigger means cooperating with the inverter means and having a trip point based on the input/output voltage standard of the input; and a control means cooperating with the trigger means and comprising a configuration means for configuring the trigger means between a first and a second state, wherein the trigger means comprises at least a first transistor having a first electrical characteristic and a second transistor having a second electrical characteristic.

18. The circuit of claim 17 wherein the trip point is at least partly based on the first and second electrical characteristics of the first and second transistors.

19. The circuit of claim 17 wherein the first and second electrical characteristics are at least partially based on physical attributes of the first and second transistors.

* * * * *